US012683542B2

(12) United States Patent
Forrest

(10) Patent No.: US 12,683,542 B2
(45) Date of Patent: Jul. 14, 2026

(54) ORGANIC OPTOELECTRONIC DEVICE AND METHOD

(71) Applicant: The Regents of the University of Michigan, Ann Arbor, MI (US)

(72) Inventor: Stephen R. Forrest, Ann Arbor, MI (US)

(73) Assignee: The Regents of the University of Michigan

( * ) Notice: Subject to any disclaimer, the term of this patent is extended or adjusted under 35 U.S.C. 154(b) by 30 days.

(21) Appl. No.: 18/469,914

(22) Filed: Sep. 19, 2023

(65) Prior Publication Data

US 2024/0097612 A1 Mar. 21, 2024

Related U.S. Application Data

(60) Provisional application No. 63/408,745, filed on Sep. 21, 2022.

(51) Int. Cl.
| | |
|---|---|
| *H02S 30/20* | (2014.01) |
| *H02S 30/10* | (2014.01) |
| *H10K 30/30* | (2023.01) |
| *H10K 30/82* | (2023.01) |
| *H10K 30/88* | (2023.01) |
| *H10K 77/10* | (2023.01) |

(52) U.S. Cl.
CPC .............. *H02S 30/20* (2014.12); *H02S 30/10* (2014.12); *H10K 30/30* (2023.02); *H10K 30/82* (2023.02); *H10K 30/88* (2023.02); *H10K 77/111* (2023.02)

(58) Field of Classification Search
CPC .......... H02S 30/10; H02S 30/20; H02S 20/00; H10K 30/88; H10K 30/30; H10K 77/111
See application file for complete search history.

(56) References Cited

U.S. PATENT DOCUMENTS

| | | | |
|---|---|---|---|
| 4,769,292 | A | 9/1988 | Tang |
| 5,247,190 | A | 9/1993 | Friend |
| 5,703,436 | A | 12/1997 | Forrest |
| | | (Continued) | |

FOREIGN PATENT DOCUMENTS

| | | | |
|---|---|---|---|
| EP | 1238981 | | 9/2002 |
| EP | 3855523 | A1 * | 7/2021 |
| | (Continued) | | |

OTHER PUBLICATIONS

Machine translation of WO-9961721-A2, Mueller H. (Year: 1999).*

(Continued)

*Primary Examiner* — Mayla Gonzalez Ramos
(74) *Attorney, Agent, or Firm* — Riverside Law LLP

(57) ABSTRACT

An optoelectronic system comprising a flexible optoelectronic device, wherein the device comprises a flexible plastic substrate, a coating comprising a glass or a polymer, positioned over the flexible plastic substrate, an anode and a cathode positioned over the coating, an organic heterojunction positioned between the anode and the cathode, comprising a donor material and an acceptor material, and an encapsulating layer comprising a glass or a polymer, positioned over the anode and the cathode. The device further comprises a roller configured to roll the flexible optoelectronic device into a stored position and a frame configured to mount the roller and the optoelectronic device.

20 Claims, 6 Drawing Sheets

Deployed

(56) References Cited

U.S. PATENT DOCUMENTS

| | | | |
|---|---|---|---|
| 5,707,745 | A | 1/1998 | Forrest |
| 5,834,893 | A | 11/1998 | Bulovic |
| 5,844,363 | A | 12/1998 | Gu |
| 6,013,982 | A | 1/2000 | Thompson |
| 6,087,196 | A | 7/2000 | Sturm |
| 6,091,195 | A | 7/2000 | Forrest |
| 6,097,147 | A | 8/2000 | Baldo |
| 6,294,398 | B1 | 9/2001 | Kim |
| 6,303,238 | B1 | 10/2001 | Thompson |
| 6,337,102 | B1 | 1/2002 | Forrest |
| 6,468,819 | B1 | 10/2002 | Kim |
| 7,122,398 | B1 | 10/2006 | Pichler |
| 7,279,704 | B2 | 10/2007 | Walters |
| 7,431,968 | B1 | 10/2008 | Shtein |
| 7,968,146 | B2 | 6/2011 | Wagner |
| 8,418,401 | B2 | 4/2013 | Chuang |
| 9,450,131 | B1 | 9/2016 | Spence |
| 11,057,991 | B2 | 7/2021 | Rogers |
| 2003/0230980 | A1 | 12/2003 | Forrest |
| 2004/0174116 | A1 | 9/2004 | Lu |
| 2009/0267507 | A1 | 10/2009 | Takashima |
| 2013/0026452 | A1 | 1/2013 | Kottas |
| 2013/0119354 | A1 | 5/2013 | Ma |
| 2014/0352762 | A1* | 12/2014 | Carter ..................... H10F 77/45 |
| | | | 136/247 |
| 2015/0221886 | A1* | 8/2015 | Klun ........................ C08J 7/048 |
| | | | 427/407.1 |
| 2020/0036325 | A1* | 1/2020 | Poivet ..................... H02S 30/20 |
| 2021/0159449 | A1* | 5/2021 | Joimel ................... H10K 71/00 |
| 2021/0320270 | A1 | 10/2021 | Li |
| 2023/0019165 | A1* | 1/2023 | Baudo ....................... E06B 9/42 |
| 2023/0088880 | A1 | 3/2023 | Forrest |
| 2024/0097612 | A1 | 3/2024 | Forrest |

FOREIGN PATENT DOCUMENTS

| | | | | |
|---|---|---|---|---|
| FR | 3066324 | A1 * | 11/2018 | ........ H01L 51/0097 |
| GB | 2613903 | A | 1/2022 | |
| JP | 2010135467 | | 6/2010 | |
| WO | WO-9961721 | A2 * | 12/1999 | ............. E04F 10/06 |
| WO | 2004111066 | A1 | 12/2004 | |
| WO | 2008044723 | | 4/2008 | |
| WO | 2008057394 | A1 | 5/2008 | |
| WO | 2010011390 | A2 | 1/2010 | |
| WO | 2010111175 | | 9/2010 | |

OTHER PUBLICATIONS

Machine translation of EP-3855523-A1, Hirano T. (Year: 2021).*

A novel agricultural photovoltaic system based on solar spectrum separation, Solar Energy, vol. 162, 2018, pp. 84-94.

Baldo et al., "Highly Efficient Phosphorescent Emission from Organic Electroluminescent Devices," Nature, vol. 395, pp. 151-154 (1998).

Baldo et al., "Very High-Efficiency Green Organic Light-Emitting Devices Based on Electrophosphorescence," Appl. Phys. Lett., vol. 75, No. 1, pp. 4-6 (1999).

Hafiz K. M. Sheriff Jr., Yongxi Li, Boning Qu, and Stephen R. Forrest, Appl. Phys. Lett. 118, 033302 (2021).

Suen, Chyi-Shan, and Xi Chu. "Multilayer thin film barrier for protection of flex-electronics." Solid State Technology, vol. 51, No. 3, Mar. 2008, pp. 36.

X. Rodríguez-Martínez, S. Riera-Galindo, L. E. Aguirre, M. Campoy-Quiles, H. Arwin, O. Inganäs, Laminated Organic Photovoltaic Modules for Agrivoltaics and Beyond: An Outdoor Stability Study of All-Polymer and Polymer: Small Molecule Blends. Adv. Funct. Mater. 2023, 33, 2213220. https://doi.org/10.1002/adfm.202213220.

* cited by examiner

100

200

Deployed collapsible support
structure 403 rollable ST PVs

401 hinge

402

ORGANIC OPTOELECTRONIC DEVICE AND METHOD

CROSS-REFERENCE TO RELATED APPLICATIONS

This application claims priority to U.S. provisional application No. 63/408,745 filed on Sep. 21, 2022, incorporated herein by reference in its entirety.

STATEMENT REGARDING FEDERALLY SPONSORED RESEARCH OR DEVELOPMENT

This invention was made with government support under DE-EE0008561 awarded by the U.S. Department of Energy. The government has certain rights in the invention.

BACKGROUND OF THE INVENTION

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

Photosensitive optoelectronic devices convert electromagnetic radiation into electricity. Solar cells, also called photovoltaic (PV) devices or cells, are a type of photosensitive optoelectronic device that is specifically used to generate electrical power. PV devices, which may generate electrical energy from light sources other than sunlight, may be used to drive power consuming loads to provide, for example, lighting, heating, or to power electronic circuitry or devices such as calculators, radios, computers or remote monitoring or communications equipment. These power generation applications may involve the charging of batteries or other energy storage devices so that operation may continue when direct illumination from the sun or other light sources is not available, or to balance the power output of the PV device with the specific applications requirements.

Traditionally, photosensitive optoelectronic devices have been constructed of a number of inorganic semiconductors, e.g., crystalline, polycrystalline, and amorphous silicon, gallium arsenide, cadmium telluride, and others.

More recent efforts have focused on the use of organic photovoltaic (OPV) cells to achieve acceptable photovoltaic conversion efficiencies with economical production costs. OPVs offer a low-cost, lightweight, and mechanically flexible route to solar energy conversion. Compared with polymers, small molecule OPVs share the advantage of using materials with well-defined molecular structures and weights. This leads to a reliable pathway for purification and the ability to deposit multiple layers using highly controlled thermal deposition without concern for dissolving, and thus damaging, previously deposited layers or sub cells.

In addition to the pursuit of high device efficiency, OPVs have unique advantages, such as the application of semi-transparent solar cells for use in building integrated photovoltaics (BIPV). Considering the vast surface areas of windows and facades in modern urban environments, developing semi-transparent solar cells with both high efficiency and transmittance has become increasingly important.

Semi-transparent Organic Photovoltaics (ST-OPVs) have been demonstrated which have visible transparencies of 50%, along with power conversion efficiencies of 10%. The transparencies can in some embodiments be tuned from 0-100%, with efficiencies as high as 20% (depending on the transparency). Further, previous work has demonstrated operational lifetimes >>30 years. ST solar cells have been proposed and demonstrated for use in greenhouses since they can allow visible radiation to nourish the plants while providing electricity, thus in principle allowing for carbon-negative greenhouse operation.

However, there is a much larger application space for ST-OPVs. That is outdoors in fields. Today, Germany has limited the deployment of solar panels on farmland to 20% of a farmer's acreage since farmers have found that serving as solar power stations is more lucrative than growing crops or grazing livestock. This is an unnecessary trade-off. Thus, there is a need in the art for an outdoor OPV architecture which allows for simultaneous power generation and agriculture.

SUMMARY OF THE INVENTION

In one aspect, presented herein is an optoelectronic system, comprising a flexible optoelectronic device. The device comprises a flexible plastic substrate, a coating comprising a glass or a polymer, positioned over the flexible plastic substrate, an anode and a cathode positioned over the coating, an organic heterojunction positioned between the anode and the cathode, comprising a donor material and an acceptor material, and an encapsulating layer comprising a glass or a polymer, positioned over the anode and the cathode. The system further includes a roller configured to roll the flexible optoelectronic device into a stored position and a frame configured to mount the roller and the optoelectronic device. In one embodiment, the frame has a height of at least eight feet from the ground.

In another aspect, the frame further comprises a collapsible support structure and is further configured to position the flexible plastic substrate in an extended configuration, at an angle between parallel to the ground and 30 degrees from the ground when deployed. In the sane or different aspect, the collapsible support structure comprises a scissor arrangement.

In another aspect, the system further comprises a motor configured to retract and deploy the flexible plastic substrate. In the same or different aspect, the device is configured to retract in the presence of rain. Furthermore, in the same or different aspect, the system further comprises a catchment reservoir.

In another aspect, the flexible optoelectronic device is at least semi-transparent to visible light. In the same or different aspect, the flexible optoelectronic device is configured to be at least semi-transparent to light in a subset of the visible spectrum optimal for cultivation of a plant. In another aspect, the flexible optoelectronic device has less than 5% transparency for light greater than 700 nm. In the same or different aspect, the flexible optoelectronic device is at least 95% transparent to red light. In the same or different aspect, the flexible optoelectronic device is at least in the range of 40%-60% transparent to blue light. In the same or different aspect, the flexible optoelectronic device is at least 10%-20% transparent to green light.

In another aspect, the anode comprises at least one of indium tin oxide (ITO), tin oxide (TO), gallium indium tin oxide (GITO), zinc oxide (ZO), zinc indium tin oxide (ZITO), Ag, Au, Pd, Pt, Ti, V, Zn, Sn, Al, Co, Ni, Cu, Cr, polyanaline (PANI), and 3,4-polyethylenedioxythiophene: polystyrenesulfonate (PEDOT:PSS). In the same or different aspect, the cathode comprises at least one of indium tin oxide (ITO), tin oxide (TO), gallium indium tin oxide (GITO), zinc oxide (ZO), zinc indium tin oxide (ZITO), Ag, Au, Pd, Pt, Ti, V, Zn, Sn, Al, Co, Ni, Cu, Cr, polyanaline (PANI), and 3,4-polyethylenedioxythiophene:polystyrene-sulfonate (PEDOT:PSS).

In another aspect, the flexible plastic substrate has a thickness in the range of 10-100 μm.

In another aspect, the encapsulating layer comprises a multilayer of a plurality of dyads. In the same or different aspect, the plurality of dyads comprises three dyads. In the same or different aspect, each dyad has a thickness in the range of 10-50 nm. In the same or different aspect, the plurality of dyads are separated by a polymer between each dyad. In the same or different aspect, the polymer has a thickness in the range of 1-10 μm.

BRIEF DESCRIPTION OF THE DRAWINGS

The foregoing purposes and features, as well as other purposes and features, will become apparent with reference to the description and accompanying figures below, which are included to provide an understanding of the invention and constitute a part of the specification, in which like numerals represent like elements, and in which.

DETAILED DESCRIPTION

Figure 1:
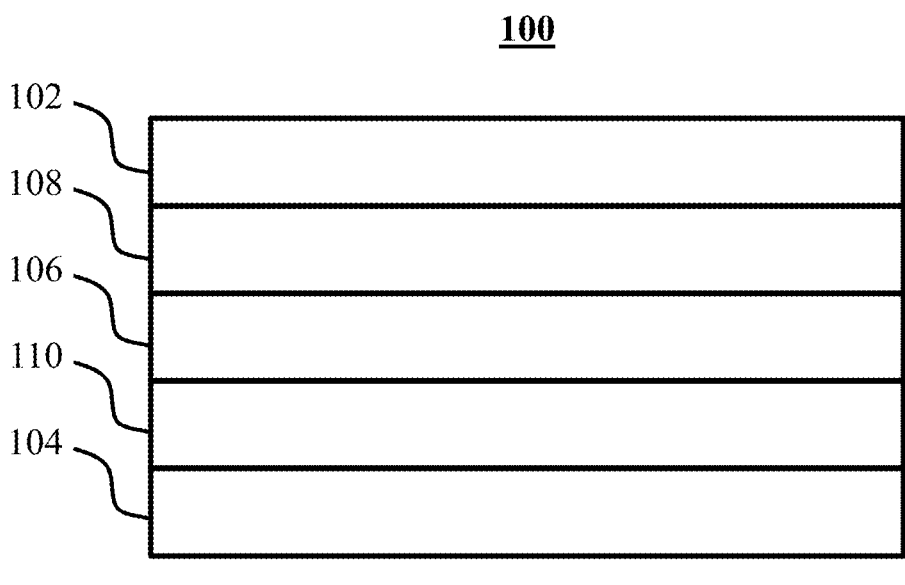
FIG. 1 shows an exemplary organic photovoltaic (OPV) device.

It is to be understood that the figures and descriptions of the present invention have been simplified to illustrate elements that are relevant for a clear understanding of the present invention, while eliminating, for the purpose of clarity, many other elements found in related systems and methods. Those of ordinary skill in the art may recognize that other elements and/or steps are desirable and/or required in implementing the present invention. However, because such elements and steps are well known in the art, and because they do not facilitate a better understanding of the present invention, a discussion of such elements and steps is not provided herein. The disclosure herein is directed to all such variations and modifications to such elements and methods known to those skilled in the art.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, exemplary methods and materials are described.

As used herein, each of the following terms has the meaning associated with it in this section.

The articles "a" and "an" are used herein to refer to one or to more than one (i.e., to at least one) of the grammatical object of the article. By way of example, "an element" means one element or more than one element.

"About" as used herein when referring to a measurable value such as an amount, a temporal duration, and the like, is meant to encompass variations of 20%, ±10%, ±5%, ±1%, and ±0.1% from the specified value, as such variations are appropriate.

Throughout this disclosure, various aspects of the invention can be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 2.7, 3, 4, 5, 5.3, 6 and any whole and partial increments therebetween. This applies regardless of the breadth of the range.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. A dendrimer may be a "small molecule," and it is believed that all dendrimers currently used in the field of organic opto-electronic devices are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of a material. A ligand may be referred to as "ancillary" when it is believed that the ligand does not contribute to the photoactive properties of a material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, on a conventional energy level diagram, with the vacuum level at the top, a "shallower" energy level appears higher, or closer to the top, of such a diagram than a "deeper" energy level, which appears lower, or closer to the bottom.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

As used herein, the terms "electrode" and "contact" may refer to a layer that provides a medium for delivering photo-generated current to an external circuit or providing a bias current or voltage to the device. That is, an electrode, or contact, provides the interface between the active regions of an organic photosensitive optoelectronic device and a wire, lead, trace or other means for transporting the charge carriers to or from the external circuit. Examples of electrodes include anodes and cathodes, which may be used in a photosensitive optoelectronic device.

As used herein, the term "transparent" may refer to an electrode that permits at least 50% of the incident electromagnetic radiation in relevant wavelengths to be transmitted through it. In a photosensitive optoelectronic device, it may be desirable to allow the maximum amount of ambient electromagnetic radiation from the device exterior to be admitted to the photoconductive active interior region. That is, the electromagnetic radiation must reach a photoconductive layer(s), where it can be converted to electricity by photoconductive absorption. This often dictates that at least one of the electrical contacts should be minimally absorbing and minimally reflecting of the incident electromagnetic radiation. In some cases, such a contact should be transparent or at least semi-transparent.

As used herein, the term "semi-transparent" may refer to an electrode that permits some, but less than 50% transmission of ambient electromagnetic radiation in relevant wavelengths.

The opposing electrode may be a reflective material so that light which has passed through the cell without being absorbed is reflected back through the cell.

As used and depicted herein, a "layer" refers to a member or component of a photosensitive device whose primary dimension is X-Y, i.e., along its length and width. It should be understood that the term layer is not necessarily limited to single layers or sheets of materials.

In addition, it should be understood that the surfaces of certain layers, including the interface(s) of such layers with other material(s) or layers(s), may be imperfect, wherein said surfaces represent an interpenetrating, entangled or convoluted network with other material(s) or layer(s).

Similarly, it should also be understood that a layer may be discontinuous, such that the continuity of said layer along the X-Y dimension may be disturbed or otherwise interrupted by other layer(s) or material(s).

As used herein, a "photoactive region" refers to a region of the device that absorbs electromagnetic radiation to generate excitons. Similarly, a layer is "photoactive" if it absorbs electromagnetic radiation to generate excitons. The excitons may dissociate into an electron and a hole in order to generate an electrical current.

As used herein, the terms "donor" and "acceptor" refer to the relative positions of the highest occupied molecular orbital ("HOMO") and lowest unoccupied molecular orbital ("LUMO") energy levels of two contacting but different organic materials. If the LUMO energy level of one material in contact with another is lower, then that material is an acceptor. Otherwise it is a donor. It is energetically favorable, in the absence of an external bias, for electrons at a donor-acceptor junction to move into the acceptor material, and for holes to move into the donor material.

As used herein, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Because ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, the term "band gap" ($E_g$) of a polymer may refer to the energy difference between the HOMO and the LUMO. The band gap is typically reported in electron-volts (eV).

The band gap may be measured from the UV-vis spectroscopy or cyclic voltammetry. A "low band gap" polymer may refer to a polymer with a band gap below 2 eV, e.g., the polymer absorbs light with wavelengths longer than 620 nm.

As used herein, the term "excitation binding energy" ($E_B$) may refer to the following formula: $E_B=(M^++M^-)-(M^*+M)$, where $M^+$ and $M^-$ are the total energy of a positively and negatively charged molecule, respectively; $M^*$ and $M$ are the molecular energy at the first singlet state (Si) and ground state, respectively. Excitation binding energy of acceptor or donor molecules affects the energy offset needed for efficient exciton dissociation. In certain examples, the escape yield of a hole increases as the HOMO offset increases. A decrease of exciton binding energy $E_B$ for the acceptor molecule leads to an increase of hole escape yield for the same HOMO offset between donor and acceptor molecules.

As used herein, power conversion efficiency ($\eta_p$) may be expressed as:

$$\eta_p = \frac{V_{OC} * FF * J_{SC}}{P_O}$$

wherein $V_{OC}$ is the open circuit voltage, FF is the fill factor, $J_{SC}$ is the short circuit current, and $P_O$ is the input optical power.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution-based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as inkjet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present disclosure may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Although certain embodiments of the disclosure are discussed in relation to one particular device or type of device (for example OPVs) it is understood that the disclosed improvements may be equally applied to other devices, including but not limited to OLEDs, PLEDs, charge-coupled devices (CCDs), photosensors, or the like.

Although exemplary embodiments described herein may be presented as methods for producing particular circuits or devices, for example OPVs, it is understood that the materials and structures described herein may have applications in devices other than OPVs. For example, other optoelectronic devices such as OLEDs and organic photodetectors may employ the materials and structures. More generally, organic devices, such as organic transistors, or other organic electronic circuits or components, may employ the materials and structures.

In some embodiments, the optoelectronic device has one or more characteristics selected from the group consisting of being flexible, being rollable, being foldable, being stretchable, and being curved. In some embodiments, the optoelectronic device is transparent or semi-transparent. In some embodiments, the optoelectronic device further comprises a layer comprising carbon nanotubes.

Conductivity Dopants

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

For example, and without limitation, the devices described herein can be used anywhere around the world, especially countries where agriculture is present. It may be especially useful in countries, such as India, where crops provide only minimal subsistence and there is a chronic shortage of electricity; the device described solves both problems: providing food, electricity, and excess income to the farmers. The disclosed device exemplifies a truly transformative use of ST-OPVs and similar technologies that can turn farming into a carbon-neutral industry for the first time since the industrial revolution.

Another particular advantage of ST-OPVs, although it can be realized to a lesser extent by other thin film PV technologies, is the ability of the device to be mounted on flexible films. The devices themselves may, in some embodiments, be encapsulated against environmental degradation, for example by multilayer glass/polymer coatings as explained below and shown in FIG. 3.

Organic Photovoltaic Cells

Described herein is an optoelectronic system, comprising a flexible optoelectronic device. The various systems and methods disclosed herein may be provided within a single-junction solar cell, or optoelectronic device, or a multi-junction, or tandem, solar cell. The flexible properties of the device include being rolled up for storage or being able to be placed on frames of varying shapes and sizes, as described below. The system described herein may be used by farmers as transparent solar cells over fields in order to help with plant growth and generating electricity and many other uses described herein.

FIG. 1 depicts an example of various layers of a single-junction solar cell or organic photovoltaic cell (OPV) 100. The exemplary OPV 100 includes an anode 102, cathode 104, active layer 106, intermediate layer 108, and another intermediate layer 110.

The OPV cell may include two electrodes having an anode 102 and a cathode 104 in superposed relation, at least one donor composition, and at least one acceptor composition, wherein the donor-acceptor material or active layer 106 is positioned between the two electrodes 102, 104. In some embodiments, active layer 106 may be an organic hetero-junction, as explained below. In some embodiments, at least one intermediate layer 108 may be positioned between the anode 102 and the active layer 106. Additionally, or alternatively, at least one intermediate layer 110 may be positioned between the active layer 106 and cathode 104.

Still referring to FIG. 1, the anode 102 may include a conducting oxide, thin metal layer, or conducting polymer. In some examples, the anode 102 includes a (e.g., transparent) conductive metal oxide such as indium tin oxide (ITO), tin oxide (TO), gallium indium tin oxide (GITO), zinc oxide (ZO), or zinc indium tin oxide (ZITO). In other examples, the anode 102 includes a thin metal layer, wherein the metal is selected from the group consisting of Ag, Au, Pd, Pt, Ti, V, Zn, Sn, Al, Co, Ni, Cu, Cr, or combinations thereof. In yet other examples, the anode 102 includes a (e.g., transparent) conductive polymer such as polyanaline (PANI), or 3,4-polyethyl-enedioxythiophene.polystyrenesulfonate (PEDOT:PSS).

The thickness of the anode 102 may be 0.1-100 nm, 1-10 nm, 0.1-10 nm, or 10-100 nm.

Continuing to refer to FIG. 1, the cathode 104 may be a conducting oxide, thin metal layer, or conducting polymer similar or different from the materials discussed above for the anode 102. In certain examples, the cathode 104 may include a metal or metal alloy. The cathode 104 may include Ca, Al, Mg, Ti, W, Ag, Au, or another appropriate metal, or an alloy thereof.

The thickness of the cathode 104 may be 0.1-100 nm, 1-10 nm, 0.1-10 nm, or 10-100 nm.

The optoelectronic device additionally comprises a flexible plastic substrate as one of its layers. A flexible plastic substrates, as used herein, is defined as a bottom layer component of a solar cell. The substrate may protect the backside of the optoelectronic device from the effects of weather conditions and may mitigate any electric shock hazards, such as different environmental conditions like moisture, UV exposure and other performance threats. The substrate may further consist of multiple layers of adhesives, barrier films, and/or polymers. The flexible plastic substrate may have any properties of any of the substrates described previously herein. In some embodiments, the flexible plastic substrate may be positioned under the active layer 106 or organic heterojunction. In some embodiments, the flexible plastic substrate comprises plastic, glass, or other suitable materials, such as a material that is transparent to at least a portion of the emissive spectrum of the OPV.

The thickness of the flexible plastic substrate may be in the range of 10-100 μm.

The optoelectronic device further comprises a coating or barrier layer over the flexible plastic substrate. The anode 102 and a cathode 104 are positioned over the coating. One purpose of the coating over the flexible plastic substrate is to protect the electrodes and organic layers of the OPV from damaging exposure to harmful species in the environment including moisture, vapor and/or gases, etc. The coating may be deposited over, under or next to a substrate, an electrode, or over any other parts of a device including an edge. The coating may comprise a single layer, or multiple layers. The coating may be formed by various known chemical vapor deposition techniques and may include compositions having a single phase as well as compositions having multiple phases. Any suitable material or combination of materials may be used for the coating. The coating may consist of a glass or a polymer. The coating may incorporate an inorganic or an organic compound or both. An exemplary coating comprises a mixture of a polymeric material and a non-polymeric material as described in U.S. Pat. No. 7,968, 146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon. Coating is further described in reference to FIG. 3B.

As noted above, the OPV may include one or more intermediate layers, for example charge collecting and transporting intermediate layers positioned between anode 102, cathode 104 and the active region or layer 106. The intermediate layer 108, 110 may be a metal oxide. In certain examples, the intermediate layer 108, 110 includes $MoO_3$, $V_2O_5$, ZnO, or $TiO_2$. In some examples, the first intermediate layer 108 has a similar composition as the second intermediate layer 110. In other examples, the first and second intermediate layers 108, 110 have different compositions.

The thickness of each intermediate layer may be 0.1-100 nm, 1-10 nm, 0.1-10 nm, or 10-100 nm.

The active region or layer 106 positioned between the electrodes 102, 104 includes a composition or molecule having an acceptor and a donor. In an embodiment, the optoelectronic device described herein has an organic heterojunction positioned between the anode 102 and the cathode 104 among the active layer 106. The organic heterojunction has a donor, or donor material, and an acceptor, or acceptor material. In some embodiments, the composition may be arranged as an acceptor-donor-acceptor (A-D-A).

The device lastly includes an encapsulating layer positioned over the anode 102 and the cathode 104. The encapsulating layer may have any of the same properties of or be made of the same materials as the coating described above. The encapsulating layer may comprise a single layer, or multiple layers. The encapsulating layer may be formed by various known chemical vapor deposition techniques and may include compositions having a single phase as well as compositions having multiple phases. Any suitable material or combination of materials may be used for the encapsulating layer. The encapsulating layer may consist of a glass or a polymer. The encapsulating layer may incorporate an inorganic or an organic compound or both. The preferred encapsulating layer may comprise a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. In one example, the mixture of a polymeric material and a non-polymeric material consists essentially of polymeric silicon and inorganic silicon.

The encapsulating layer may in some embodiments be the outermost layer of the flexible optoelectronic device and may be configured to help protect the inner layers, including the cathode and anode, from environmental or other external conditions. In an embodiment, the encapsulating layer may surround the entirety of the flexible optoelectronic device or may additionally be provided with another protective layer on top of the encapsulating layer.

Figure 3A:
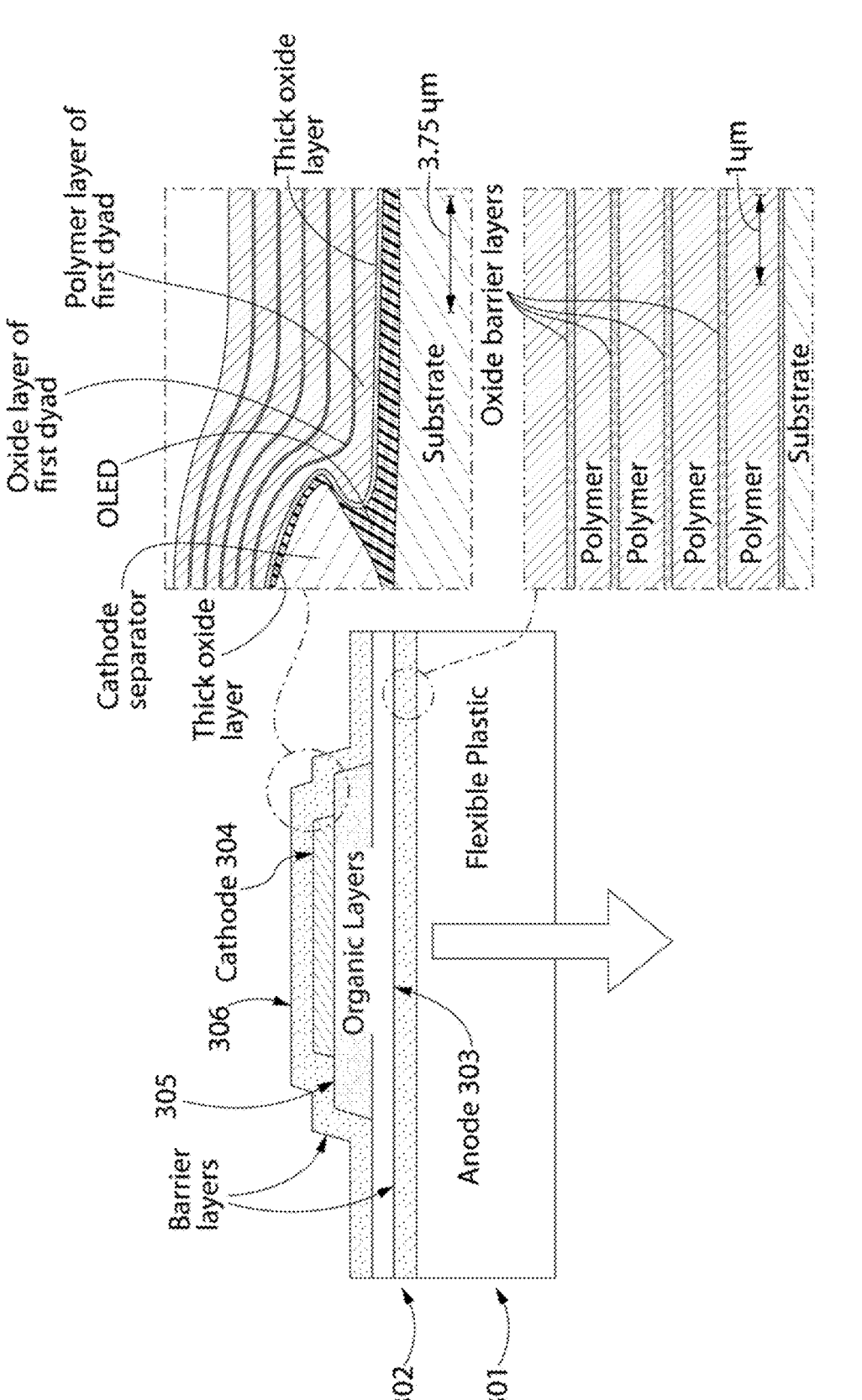
FIG. 3A is a schematic of an organic photovoltaic (OPV) encapsulated with barrier layers on both the top and bottom surfaces of the device.

Furthermore, the encapsulating layer may comprise a multilayer, wherein the multilayer comprises a plurality of molecular dyads. As used herein, the term "molecular dyads" refers to pairs of layers of different materials, for example as shown in FIG. 3A. The multilayer of the plurality of dyads may help further enhance the protection provided by the encapsulating layer. In one embodiment, the multilayer of the plurality of dyads may comprise glass, or any other similar material. The multilayer may comprise any material described in relation to the coating described previously herein. The multilayer may incorporate an inorganic or an organic compound or both. The multilayer may comprise any number of layers of dyads, for example between 2 and 10 or between 3 and 8 between 4 and 6 dyads. In one embodiment, the multilayer of dyads may include three dyads. In another embodiment, the multilayer of dyads may include two dyads. Further, each dyad of the multilayer of dyads may have a specific thickness, which in some embodiments, may be in the range of 10-500 nm or between 10 nm and 200 nm, or between 10 nm and 100 nm, or between 10 nm and 50 nm, or between 20 nm and 80 nm, or between 40 nm and 80 nm.

In some embodiments, the plurality of dyads in the multilayer may be separated by a polymer positioned between each dyad. The polymer may be any of a class of natural or synthetic substances composed of macromolecules that are multiples of monomers. The polymer may be any of the polymers as previously described herein or in referenced applications or publications. The polymer between each dyad may enable the maximum amount of light to shine through the device.

Each polymer layer may have a thickness in the range of 1-10 μm.

Figure 2:
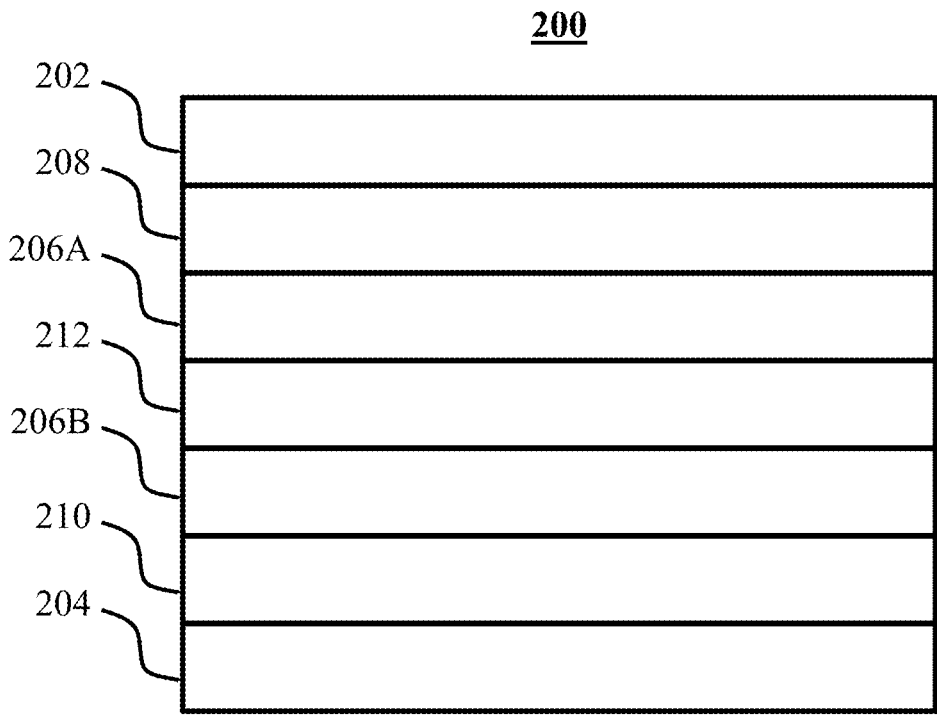
FIG. 2 shows an inverted OPV device that does not have a separate electron transport layer.

Now referring to FIG. 2, depicted is an example of various layers of a tandem or multi-junction solar cell or organic photovoltaic cell (OPV) 200. The OPV cell may include two electrodes having an anode 202 and a cathode 204 in superposed relation, at least one donor composition, and at least one acceptor composition positioned within a plurality of active layers or regions 206A, 206B between the two electrodes 202, 204. While only two active layers or regions 206A, 206B are depicted in FIG. 2, additional active layers or regions may also be possible for the invention described herein. Anode 202 may share any of the same qualities or characteristics described above for anode 102. Cathode 204 may share any of the same qualities or characteristics described above for cathode 104. Plurality of active layers or regions 206A and 206B may share any of the same qualities or characteristics described above for active layer or region 106. At least one intermediate layer 208 may share any of the same qualities or characteristics described above for intermediate layers 108 and 110.

In one embodiment, at least one intermediate layer 208 may be positioned between the anode 202 and a first active layer 206A. Additionally, or alternatively, at least one intermediate layer 210 may be positioned between the second active layer 206B and cathode 204. Furthermore, in another embodiment, at least one intermediate layer 212 may be positioned between the first active layer 206A and the second active layer 206B. The compositions, thicknesses, etc. of each layer may be the same as those discussed with reference to FIG. 1.

In one embodiment, the plurality of active layers or regions 206A, 206B may include an organic heterojunction comprising the donor and acceptor materials. In another embodiment, the organic heterojunction may be its own organic layer or apart of any other organic layer, as long as it is positioned between the electrodes. The active region or layer 106, 206A, 206B positioned between the electrodes includes a composition or molecule having an acceptor and a donor. The composition may be arranged as an acceptor-donor-acceptor (A-D-A).

The OPV 200 may further include an encapsulating layer comprising a glass or a polymer, positioned over the anode and the cathode. The encapsulating layer may comprise of a multilayer of dyads, as explained previously. The multilayer of dyads may be separated by a polymer between each dyad.

Now referring to FIG. 3A, a schematic of an OPV encapsulated with barrier layers on both the top and bottom surfaces of the device on a plastic substrate is shown. As described herein, the OPV comprises a flexible plastic substrate 301, a coating 302, an anode 303, a cathode 304, an organic heterojunction 305, and an encapsulating layer 306. Scanning electron microscope images of the flexible top and bottom multilayer encapsulation layers are at right, wherein the bottom multilayer, or coating, is further shown in FIG. 3B.

Figure 3B:
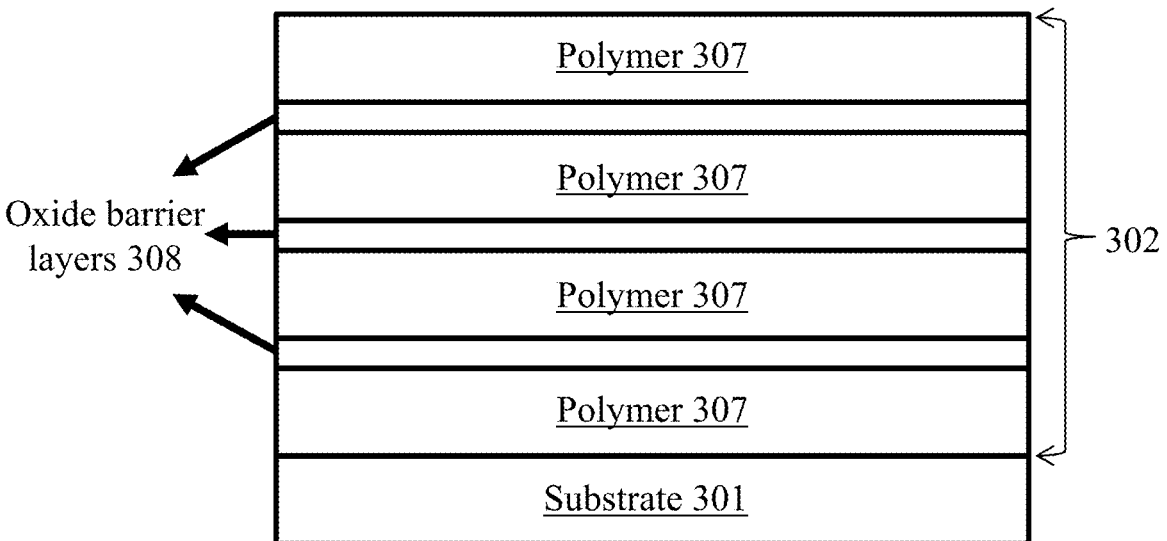
FIG. 3B shows a zoomed-in view of the barrier and polymer layers comprising coating 302.

The barrier layers shown may include the coating and encapsulating layers as described above. Referring now to FIG. 3B, exemplary layers of coating 302 are shown. The layers of polymers 307 are shown above flexible plastic substrate 301 that comprise the coating 302, which, in one embodiment, may have the same or similar makeup as the encapsulating layer 306. Oxide barrier layers 308 shown are synonymous with coating 302 and represent the same material doing the same function. In some embodiments, the encapsulating layer 306 may be configured to be able to be flexible enough to conform the shape of the flexible optoelectronic device; the shape of the device may depend on the varying thicknesses and shapes of the layers of the flexible device.

The devices and methods disclosed herein deploy ST-OPVs (or other transparent cell technologies) to cover large fractions and even entire fields with transparent solar cells at a height above the ground, leaving room underneath for growth or livestock. This is beneficial as the farmers can grow their crops or graze their livestock underneath, while the ST-OPVs may still allow sufficient sunlight to provide robust plant growth while simultaneously generating electricity. Thus, farmers can both generate electricity, grow their crops, and allow their livestock to graze without any solar cells getting in the way or damaged due to the environment or animals themselves.

However, an issue arises in determining how rainwater will reach the crops underneath if the transparent solar cells are covering them and inhibiting the ability to get water to the plants. In one embodiment, since the solar cells generate electricity, electric pumps may be attached to the base of the panels along with a catchment reservoir or plurality of catchment reservoirs to collect water that falls off the panels. The catchment reservoir or plurality thereof may be configured to distribute that collected water onto the ground into gutters and channels. In another embodiment, the catchment reservoirs may be connected to a sort of sprinkler or water distribution system underneath the transparent solar cells. In other embodiments, he electric pumps and catchment reservoir(s) may be located anywhere on the optoelectronic system. In another embodiment, gravity feed of water in suitably tilted landscapes can also be used to eliminate the use of pumps, such as placing the transparent solar cells on a specific angle.

Another solution, and the one used by the invention described herein, is the transparent solar cells having the ability to be rolled up and stored away to mitigate harm from the environment and to allow rain to fall on the crops without interference. This allows the rain to fall naturally to the crops without having to be collected first and then distributed, saving time and money for the farmers. This solution is further explained below with reference to FIGS. 4A and 4B.

Figure 4A:
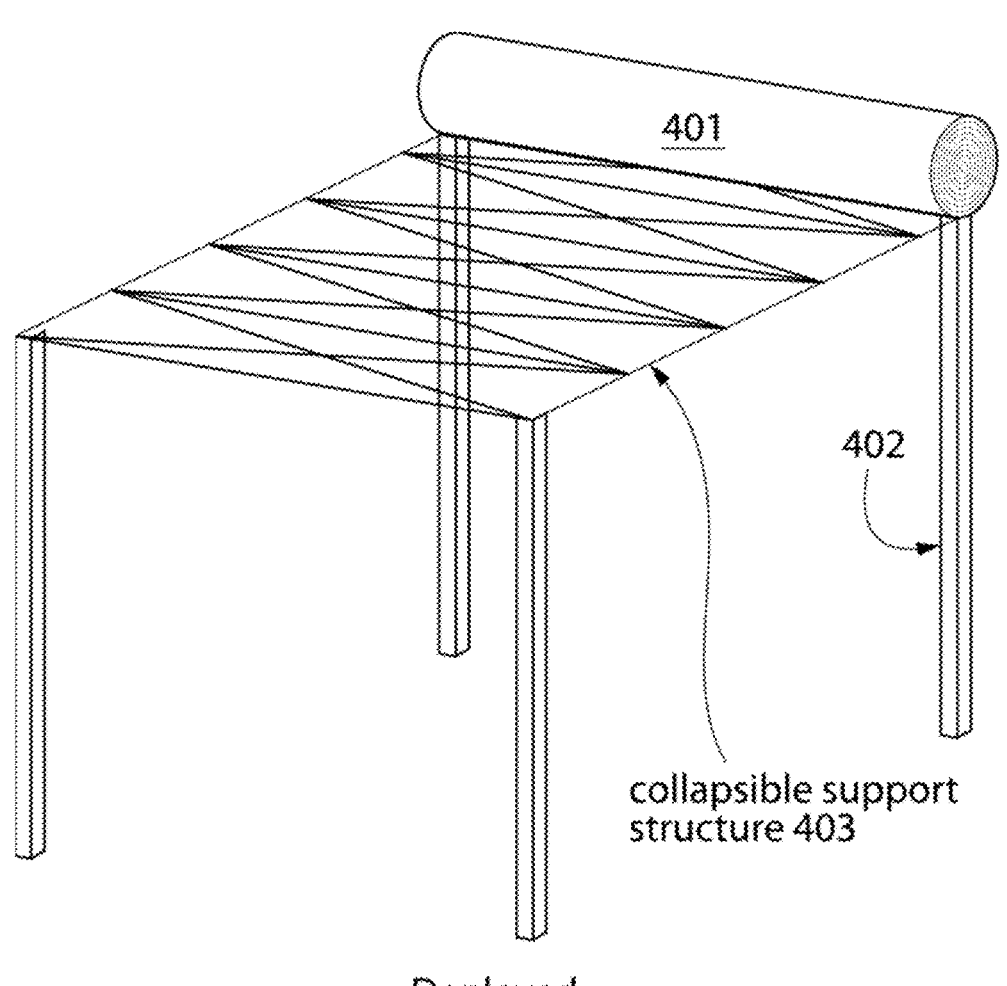
FIG. 4A is an exemplary deployment of a roll of flexible ST-OPV cells on top of a frame.
Figure 4A:
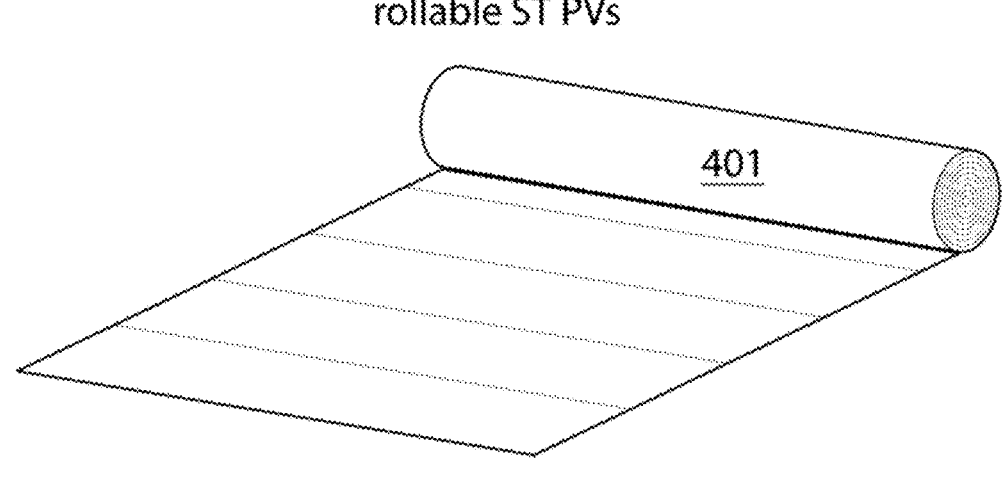

Now referring to FIG. 4A, the flexibility of the plastic substrate and the optoelectronic device overall allows for the transparent solar panels to be rolled up and stored away. The flexibility may allow for complete retraction of the panels. While ordinarily the panels can be mounted on supports sufficiently high such that conventional farm machinery can pass underneath, exceptionally high equipment such as combine harvesters may require unrealistically costly support systems that allow clearance. A solution to this is to retract flexible solar cells into rolls using electric motors, and a boom with a cable to hinge the roll upward and out of the way. In an embodiment, the flexible optoelectronic device further includes a roller 401, frame 402, and a collapsible support structure 403 configured to roll the flexible optoelectronic device into a stored position.

Continuing to refer to FIG. 4A, roller 401 rolls the flexible optoelectronic device up in order for rain to get to the crops. Roller 401 may be initiated to roll up and store the solar cells in any way, electrically, automatically, manually, etc. The flexible optoelectronic device may further be configured to retract in the presence of rain. In an embodiment, the roller 401 may be configured to be connected to a sort of sensor or sensing device wherein the roller 401 is initiated once rain, water, or wet weather is detected. A sensor suitable for use with such a device may include a moisture sensor, a humidity sensor, a barometric pressure sensor, a light sensor, or a temperature sensor. Similarly, the device may be connected to a database concerning weather predictions so the roller 401 may be initiated once rain is predicted. In the same or different embodiment, the roller 401 may also be initiated manually by the farmer, such as with a button, crank, or anything similar.

Roller 401 may further be any shape, size, or length, as long as the flexible optoelectronic device can be efficiently rolled up and stored away. The roller 401 and frame 402 are described herein in reference to the following dimensions shown in FIG. 4A—width 410, length 411, and height 412. Roller 401 may be the same width as the device or may have a different width. In an embodiment, roller 401 runs along the entirety of a side of the flexible OPV sheet. Roller 401 may be cylindrical, rectangular, triangular, or any shape suitable for storing the flexible OPV sheet in a rolled configuration. Furthermore, and in an embodiment, roller 401 may include a lip 406 on either end (along width 410) of the roller, for example to prevent the flexible sheet from sliding off the roller. In another embodiment, the width of roller 401 may be the same as a width and/or a height of frame 402. The roller may have a width between 1 m and 10 m, or between 1 m and 5 m, or between 1 m and 3 m, or about 2 m, or about 3 m, or about 4 m, or about 5 m. The roller may have a diameter, when in a rolled-up configuration, of 10 cm-1.5 m, 20 cm-80 cm, 30 cm-50 cm, or about 10 cm, about 20 cm, about 30 cm, about 40 cm, or about 50 cm. Roller 401 may be made of any material that is rigid enough to hold the weight of the optoelectronic device and withstand the harsh environment, such as, without limitation, metal, fiberglass, plastic etc.

Referring still to FIG. 4A, the disclosed optoelectronic system may further comprise a frame 402 configured to mount the roller 401 and the flexible OPV sheet 408 above the ground. Frame 402 may be configured to hold the flexible optoelectronic device 408 above crops. Frame 402 may mount the roller 401 and the device at a specific height above the ground. For example, frame 402 may hold the device and roller 401 at a height of between 10 cm and 10 m, or between 50 cm and 3 m, or between 1 m and 3 m, or at least 1 m, at least 2 m, at least 3 m, at least 4 m, or any other suitable height above the ground. In an embodiment, the height of frame 402 may be dependent on what type of crop or livestock may be occupying the space beneath the solar cells. Furthermore, the frame 402 may comprise a plurality of poles configured to support the roller 401 and the device. In one embodiment, the frame 402 may consist of four poles positioned at the corners of a rectangle or square, as shown in FIG. 4A. In another embodiment the frame 402 may comprise three poles, five poles, six poles, eight poles, or any other suitable number of poles or other support structures. Poles or support structures may in some embodiments be permanently or semi-permanently embedded into the ground. In some embodiments, the frame 402 or one or more support structures of the frame 402 may have an adjustable height, where the height and angle of the solar cells are adjustable, for example using a motor, hydraulic, or other linear actuator. Adjustments may be made for example in order to raise or lower the frame in response to an approaching person or machine, or in order to angle the ST PV to maximize exposure to sunlight.

Frame 402 may be made of any suitable material, and the same or different material may be used for the collapsible support structure 403. Materials suitable for use in roller 401, frame 402, and/or support structure 403 may include metals, such as aluminum or steel, polymer, composites, carbon fiber, any other material suitable for use in an outdoor environment.

As shown in FIG. 4A, the frame 402 may comprise a collapsible support structure 403 configured to aid the frame in holding up the roller 401 and the flexible OPV sheet 408. The collapsible support structure 403 may include any flexible, sturdy material that can withstand the weight of the device and distribute the weight among the frame 402. Further, the collapsible support structure 403 may be configured to position the flexible plastic substrate in an extended configuration over the frame from the roller 401. Additionally, the collapsible support structure 403 may be configured to position the flexible plastic substrate parallel or substantially parallel to the ground. In another embodiment, the collapsible support structure may be configured to position the flexible plastic substrate at an angle relative to the ground, for example at an angle 5 degrees, 10 degrees, 20 degrees, 30 degrees, 40 degrees, 50 degrees, 60 degrees, or any other suitable angle relative to the ground when deployed. In some embodiments, support structure 403 is collapsible so that it can be manipulated over the shape of frame 402. In an embodiment, collapsible support structure 403 may remain on top of frame 402, as shown in FIG. 4A, after the flexible OPV sheet has been retracted onto roller 401. In other embodiments, an actuator may be configured to retract the support structure 403 into a retracted position, for example beneath the roller 401, simultaneously or after the flexible OPV sheet is retracted onto roller 401. In some embodiments, the support structure 403 may be configured to be removed manually.

The collapsible support structure 403 may be configured as a plurality of straight elements joined together at a plurality of hinged intersection points, similar to a scissor-lift. The support structure 403 may alternatively be configured in any other retractable configuration.

Figure 4B:
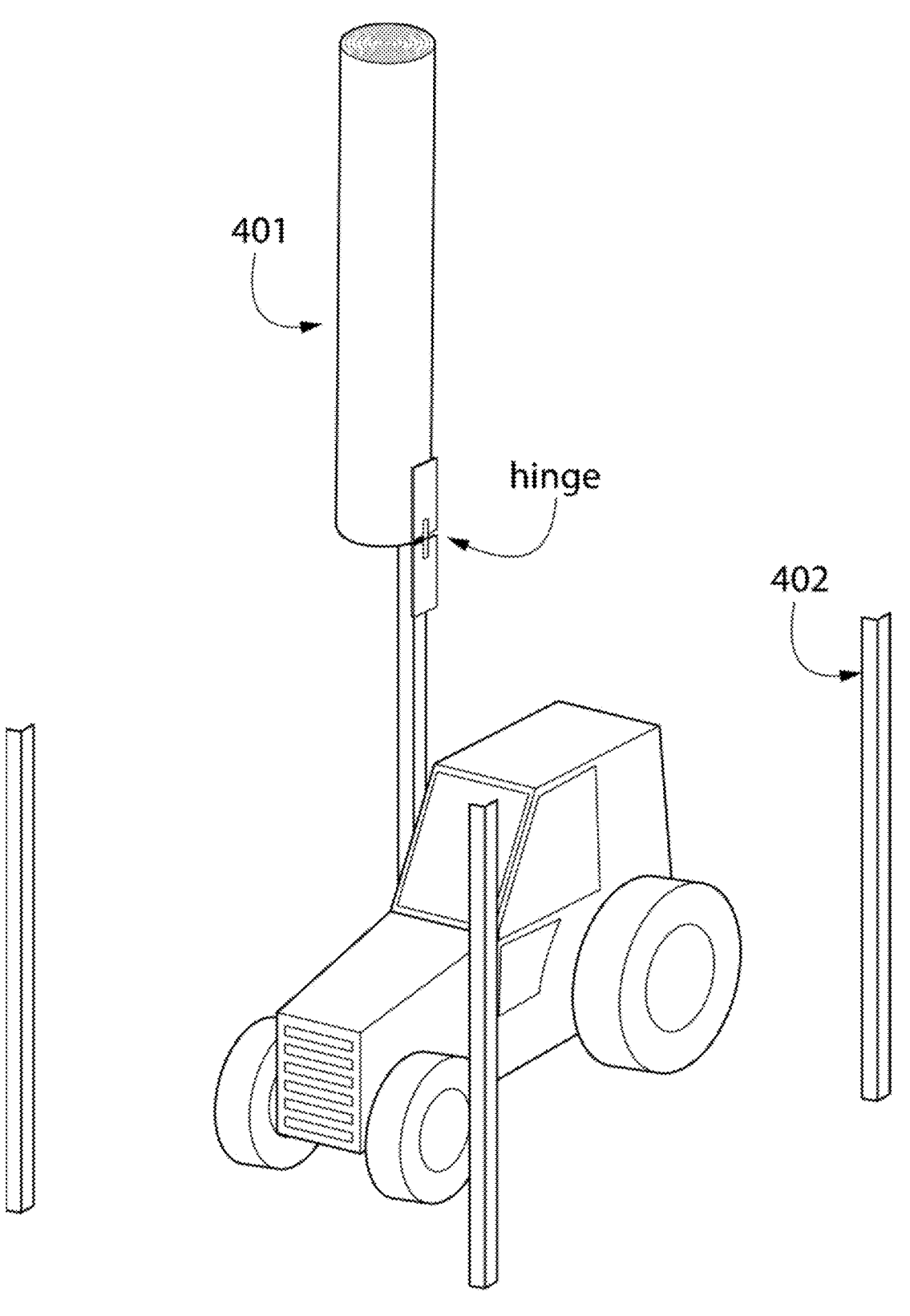
FIG. 4B is an exemplary deployment of a hinged roll of flexible ST-OPV cells on top of a frame.

Referring now to FIG. 4B, when retracted, the roller 401 may further be configured to rotate, for example with a hinge, into an orientation orthogonal to the ground as shown in FIG. 4B. The retracted configuration shown in FIG. 4B may be advantageous for example when allowing tall vehicles to pass under/through the structure, or in order to minimize the ground surface area shielded from rain.

Further, the flexible optoelectronic device may comprise a motor configured to retract and deploy the flexible plastic substrate from a deployed configuration to a retracted configuration, and vice-versa. In one embodiment, the motor may be the same motor used for any other component of the optoelectronic system, such as water pumps or for an adjustable frame. The motor may be used by roller 401 to roll up the flexible device and also to move the roller 401 into the vertical retracted configuration described above. In an embodiment the motor may further be used to collapse the collapsible support structure.

Additionally, the flexible optoelectronic device may be at least semi-transparent to visible light. In an embodiment, the flexible optoelectronic device may be configured to be at least semi-transparent to light in a subset of the visible spectrum optimal for cultivation of a plant. In another embodiment, the flexible optoelectronic device may be configured to be almost fully transparent to light in a subset of the visible spectrum optimal for cultivation of a plant. In some embodiments, the flexible optoelectronic device may have less than 5% transparency for light having a wavelength greater than 600 nm, greater than 625 nm, greater than 650 nm, greater than 675 nm, greater than 700 nm, greater than 725 nm, greater than 750 nm, greater than 775 nm, or greater than 800 nm. The flexible optoelectronic device may also be receptive to light based on its specific color. For example, and without limitation, the flexible optoelectronic device may be at least 80%, at least 85%, at least 88%, at least 90%, at least 92%, at least 95%, at least 97%, or at least 99% transparent to red light (i.e. between 600 nm and 750 nm). In another embodiment, the flexible optoelectronic device may be at least 40%, at least 50%, between 40%-60% transparent, or about 50% transparent to blue light (i.e. between 450 nm and 495 nm). In another embodiment, but without limitation, the flexible optoelectronic device may be at most 50%, at most 45%, at most 40%, at least 5%, at least 10%, at least 15%, or 10%-30% transparent, or about 20% transparent, to green light (i.e. between 495 nm and 570 nm). These values, aka the transparency spectrum of the cells, can be adjusted during fabrication to optimize growth conditions for the specific crop being cultivated.

Figure 5:
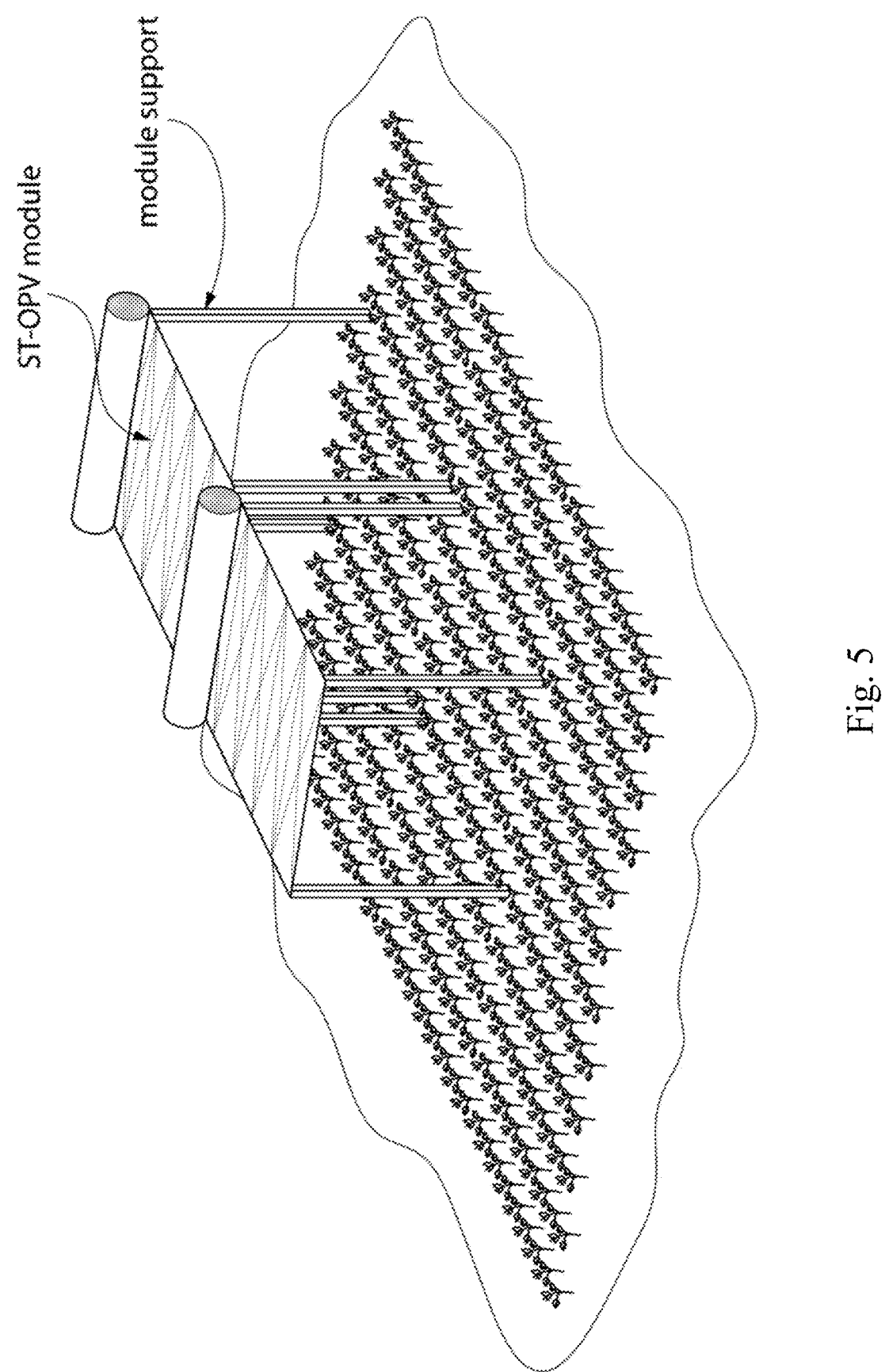
FIG. 5 is an exemplary ST-OPV device.

Now referring lastly to FIG. 5, another exemplary image of the optoelectronic system is shown. The semi-transparent OPV module is placed on top of the frame, or module support, including a collapsible structure. Also included is a roller or roll up the ST-OPV for storage.

Combination with Other Materials

The materials described herein as useful for a particular layer in an organic optoelectronic device may be used in combination with a wide variety of other materials present in the device. The materials described or referred to below are non-limiting examples of materials that may be useful in combination with the compounds disclosed herein, and one of skill in the art can readily consult the literature to identify other materials that may be useful in combination.

As previously disclosed, OPVs and other similar devices may be fabricated using a variety of techniques and devices. For example, in OVJP and similar techniques, one or more jets of material is directed at a substrate to form the various layers of the OPV.

The disclosures of each and every patent, patent application, and publication cited herein are hereby incorporated herein by reference in their entirety. While this invention has been disclosed with reference to specific embodiments, it is apparent that other embodiments and variations of this invention may be devised by others skilled in the art without departing from the true spirit and scope of the invention. The appended claims are intended to be construed to include all such embodiments and equivalent variations.

REFERENCES

The following publications are incorporated by reference herein in their entireties:

Suen, Chyi-Shan, and Xi Chu. "Multilayer thin film barrier for protection of flex-electronics." Solid State Technology, vol. 51, no. 3, March 2008, pp. 36+

S. R. Forrest, *Organic Electronics: Foundations to Applications*. Oxford, UK: Oxford University Press, 2020.

What is claimed is:

1. An optoelectronic system, comprising:
   a flexible optoelectronic device, comprising:
      a flexible plastic substrate;
      a coating comprising a glass or a polymer, positioned over the flexible plastic substrate;
      an anode and a cathode positioned over the coating;
      an organic heterojunction positioned between the anode and the cathode, comprising a donor material and an acceptor material; and
      an encapsulating layer comprising a glass or a polymer, positioned over the anode and the cathode;
   a cylindrical roller having a proximal end and a distal end, configured to roll the flexible optoelectronic device into a stored configuration about an axis extending from the proximal end to the distal end, and wherein the cylindrical roller is mounted to
   a frame with a hinged portion.

2. The system of claim 1, wherein the frame comprises a collapsible support structure.

3. The system of claim 1, wherein the flexible optoelectronic device is at least semi-transparent to visible light.

4. The system of claim 1, wherein the frame has a height of at least eight feet.

5. The system of claim 1, further comprising a catchment reservoir positioned below the flexible plastic substrate.

6. The system of claim 1, wherein the flexible plastic substrate has a thickness in the range of 10-100 $\mu$m.

7. The system of claim 1, wherein the flexible optoelectronic device has less than 5% transparency for light greater than 700 nm.

8. The system of claim 1, wherein the flexible optoelectronic device is at least 95% transparent to red light.

9. The system of claim 1, wherein the flexible optoelectronic device is at least in the range of 40%-60% transparent to blue light.

10. The system of claim 1, wherein the flexible optoelectronic device is at least in the range of 10%-30% transparent to green light.

11. The system of claim 1, wherein the proximal end of the roller is mounted to the frame with the hinged portion.

12. The system of claim 11, wherein the hinged portion is configured to adjust the roller between a vertical configuration and a horizontal configuration, such that the roller is substantially parallel to the ground in the horizontal configuration, and wherein the roller is substantially orthogonal to the ground in the vertical configuration.

13. The system of claim 1, wherein the flexible optoelectronic device is positioned above a crop when the flexible optoelectronic device is in the extended configuration.

14. An optoelectronic system, comprising:

a flexible optoelectronic device, comprising:

a flexible plastic substrate;

a coating comprising a glass or a polymer, positioned over the flexible plastic substrate;

an anode and a cathode positioned over the coating;

an organic heterojunction positioned between the anode and the cathode, comprising a donor material and an acceptor material; and an encapsulating layer comprising a glass or a polymer, positioned over the anode and the cathode;

a cylindrical roller having a proximal end and a distal end, configured to roll the flexible optoelectronic device into a stored configuration about an axis extending from the proximal end to the distal end; and a frame comprising first and second poles substantially parallel to each other, wherein the proximal end of the roller is mounted to the first pole with a hinged portion, wherein the hinged portion is configured to adjust the roller between a horizontal configuration and a vertical configuration, wherein the axis of the roller is substantially perpendicular to the first and second poles in the horizontal configuration, and wherein the axis of the roller is substantially parallel to the first and second poles in the vertical configuration, and wherein the second pole is positioned to contact the distal end of the roller in the horizontal configuration.

15. The system of claim 1, wherein the frame comprises first and second poles substantially parallel to each other, wherein the hinged portion is configured to adjust the cylindrical roller between a horizontal configuration and a vertical configuration, and wherein the axis of the cylindrical roller is substantially perpendicular to the first and second poles in the horizontal configuration.

16. The system of claim 1, wherein the frame comprises first and second poles substantially parallel to each other, wherein the hinged portion is configured to adjust the cylindrical roller between a horizontal configuration and a vertical configuration, and wherein the axis of the cylindrical roller is substantially parallel to the first and second poles in the vertical configuration.

17. The system of claim 1, wherein the frame comprises first and second poles substantially parallel to each other, wherein the proximal end of the cylindrical roller is mounted to the first pole with the hinged portion, wherein the hinged portion is configured to adjust the cylindrical roller between a horizontal configuration and a vertical configuration, and wherein the second pole is positioned to contact the distal end of the roller in the horizontal configuration.

18. The system of claim 1, further comprising a motor configured retract and deploy the flexible optoelectronic device.

19. The system of claim 2, wherein the collapsible support structure comprises a scissor arrangement.

20. The system of claim 1, further comprising a sensing device.

\* \* \* \* \*